(12) United States Patent
Matthies et al.

(10) Patent No.: US 6,873,380 B2
(45) Date of Patent: Mar. 29, 2005

(54) PROVIDING OPTICAL ELEMENTS OVER EMISSIVE DISPLAYS

(75) Inventors: Dennis L. Matthies, Mercer, NJ (US); Zilan Shen, West Windsor, NJ (US)

(73) Assignee: Intel Corporation, Santa Clara, CA (US)

( * ) Notice: Subject to any disclaimer, the term of this patent is extended or adjusted under 35 U.S.C. 154(b) by 382 days.

(21) Appl. No.: 09/904,268

(22) Filed: Jul. 12, 2001

(65) Prior Publication Data

US 2003/0011303 A1 Jan. 16, 2003

(51) Int. Cl.[7] .............................................. G02F 1/1335
(52) U.S. Cl. ...................... 349/67; 349/73; 349/74; 349/110; 349/121; 349/122; 313/474; 313/506
(58) Field of Search ............................ 349/67, 73, 74, 349/110, 121, 122; 313/506, 474

(56) References Cited

U.S. PATENT DOCUMENTS

| | | | | |
|---|---|---|---|---|
| 5,106,197 A | * | 4/1992 | Ohuchida et al. | ............. 349/73 |
| 5,661,531 A | * | 8/1997 | Greene et al. | ............... 349/73 |
| 5,867,236 A | * | 2/1999 | Babuka et al. | ............... 349/73 |
| 6,005,649 A | * | 12/1999 | Krusius et al. | ............... 349/73 |
| 6,104,457 A | * | 8/2000 | Izumi et al. | .................. 349/73 |
| 6,476,886 B2 | * | 11/2002 | Krusius et al. | ............... 349/73 |

FOREIGN PATENT DOCUMENTS

| WO | WO 99/41732 | 8/1999 |
|---|---|---|
| WO | WO 99/41787 | 8/1999 |
| WO | WO 99/41788 | 8/1999 |

OTHER PUBLICATIONS

U.S. Appl. No. 09/904,241 filed Jul. 12, 2001 Entitled "Reducing the Visibility of Seams of Modular Displays," Cover PG., pp. 1–21, Six Drawings.

* cited by examiner

Primary Examiner—Allan R. Wilson
Assistant Examiner—Edgardo Ortiz
(74) Attorney, Agent, or Firm—Trop, Pruner & Hu, P.C.

(57) ABSTRACT

A display may be formed of a plurality of abutted tiles, each tile contributing a portion of the overall displayed image. Optical elements may be selectively situated between pixels to improve the optical performance of the display. In some embodiments, these optical elements may facilitate the use of relatively thicker cover glasses over the display tiles.

21 Claims, 3 Drawing Sheets

PROVIDING OPTICAL ELEMENTS OVER EMISSIVE DISPLAYS

BACKGROUND

This invention relates generally to emissive displays including organic light emitting device (OLED) displays, light emitting diode (LED) displays and electro luminescence (EL) displays.

Emissive displays generally include a cover glass or transparent sheet over the light emissive elements. The transparent sheet generally is substantially transparent to light emissions. The thinner the glass sheet, normally the less its optical effects.

In displays made by combining a plurality of tiles, each including a cover glass, gaps may exist between adjacent tiles. The thicker the glass that is utilized, the more apparent are these gaps to viewers of such displays.

While the use of thin cover glasses has many advantages, it also has concomitant cost disadvantages. Thinner glass generally breaks more easily. In addition, manufacturing equipment is designed for certain minimum glass thicknesses. Using thinner glass may result in cost penalties or require the development of specialized equipment for handling glass processing.

Thus, the thicker the cover glass that is utilized, the more apparent are any gaps between adjacent tiles. The composite image of a large area display is the result of the images contributed by each of the tiles making up the large area display. To the extent that the individual tiles may be delineated because of the inter-tile gaps, the overall seamless effect of the display is lessened. Therefore, it is desirable to produce large area displays in which the individual tiles making up the displays are as invisible and undiscernible as possible.

Thus, while using thicker glass has many practical advantages, it may also increase the likelihood that seams between adjacent tiles become visible. Therefore, there is a need for a way to make the gaps between adjacent tiles less visible in large area displays.

State of the art tile displays, such as video walls, use mullions between individual tiles to hide the physical gap. However, if these mullions are discernible to the user, they are objectionable because they break the continuity of the image.

Another structure commonly found in non-tiled displays is a pattern of black lines. The black lines, like a mullion, produce inter-pixel black lines. A black line is put between the pixels to absorb ambient light in those areas in order to increase the display contrast. Black lines are found in non-modular displays such as cathode ray tubes and liquid crystal displays. With these displays, the black lines are smaller than the mullions. They are placed in the plane of the pixels, located between the pixels. Because the pattern of black lines is periodic and placed between pixels, it does not break the continuity of the image.

Thus, there is a need for ways to make the seams of large area displays less visible.

DETAILED DESCRIPTION

Figure 1:
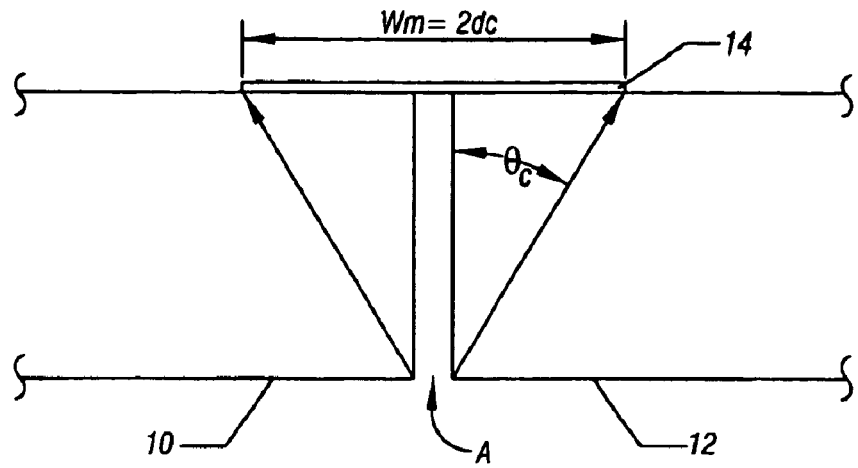
FIG. 1 is a schematic depiction of one embodiment of the present invention.

Referring to FIG. 1, a pair of adjacent display tiles 10 and 12 may combine to create a portion of an overall large area display made up of a plurality of tiles 10 and 12. The region between display tiles 10 and 12, indicated as A, is described herein as the gap. The gap A includes an upper surface which is closest to the viewer and a gap region that proceeds along the entire thickness of the tiles 10 and 12. At the top of the gap A, differences in surface reflection, such as the angle of reflection and its intensity, are most important. Below the top of the gap surface in the gap region, the differences in refraction, reflection and absorption are important if they are different in the region of the tiles between the pixels that are not straddling a gap.

Two rays are shown emanating from the lower surface of the gap A and extending upwardly at an angle $\theta_c$ called the critical angle. At the critical angle, a ray is refracted to an angle parallel to the top surface of each layer 10 or 12. Light reaching the surface with angles less than the critical angle exits the layers 10 and 12 and light reaching the surface with angles larger than the critical angle is totally internally reflected.

Because of the critical angle, light emitted from a point within the layers 10 and 12 can escape from the panels by traveling at most a lateral distance of $d_c$ which is equal to the thickness of the layers 10 or 12 times the tangent of the critical angle. Therefore, light from any part of the gap A can be completely blocked by putting a black strip 14 of width $W_m$ equal to $2d_c$ over the gap A. Because of the symmetry of the relevant optics, this same black strip 14 also blocks any external rays (not shown) from detecting the gap A.

If the strip 14 width is less than $2d_c$ but wider than the width of the top of the gap A, then it will completely hide the top of the gap A and a portion of a gap region near the top of the gap A. Thus, the strip 14 makes the top of the gap A and part or all of the underlying gap region invisible to a user. In practice, the black strip 14 may be slightly wider to account for any finite width of the gap A and for any tolerance for the mis-positioning of the black strip 14 directly over the gap A.

Using a black strip 14 that is wide enough to hide the entire gap A top and gap region makes the gap A substantially invisible. If mullions (not shown) are used around the edges of the display, a visual discontinuity may result because of the difference in widths of the mullions versus the black strips 14. Making the black strips 14 identical to the mullions may make this discontinuity less noticeable. Also the use of the strips 14 may increase the contrast of the displayed image. In some embodiments, the same techniques may be used over the regions between pixels that are used between the layers 10 and 12 to provide greater uniformity.

Figure 2:
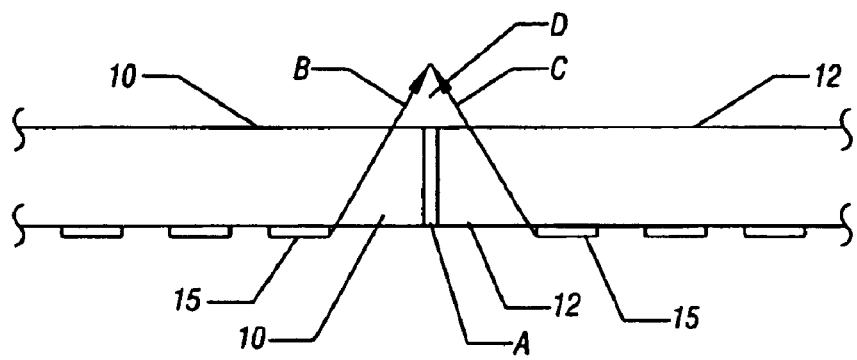
FIG. 2 is a partial, enlarged cross-sectional view of another embodiment of the present invention.

Referring to FIG. 2, a pair of transparent layers 10 and 12 may be abutted together to form part of an overall large area display. The gap A may be defined between the layers 10 and 12. Each of the layers 10 and 12 may have coated on its lower surface one or more light emitting elements 15. In the case shown in FIG. 2, a set of three light emitting elements 15 are provided, one for each color of a tricolor color space such as red, green, blue (RGB) color space.

Each of the light emitting elements 15 closest to the gap A emits light having a ray most adjacent to the gap A and indicated by the letters B and C. As a result, a space D may be defined over the strip 14 that is not impacted by any emitted light. In particular, the strip 14 may be sized so that it obscures the gap A while refraining from blocking substantial light emitted by the light emitting elements 15.

In some embodiments of the present invention, the light emitting elements 15 may be any emissive elements including an organic light emitting device (OLED), a light emitting diode (LED), or an electroluminescent display (EL), to mention a few examples. However, the other display technologies may be utilized including liquid crystal display technologies in some embodiments.

Figure 3:
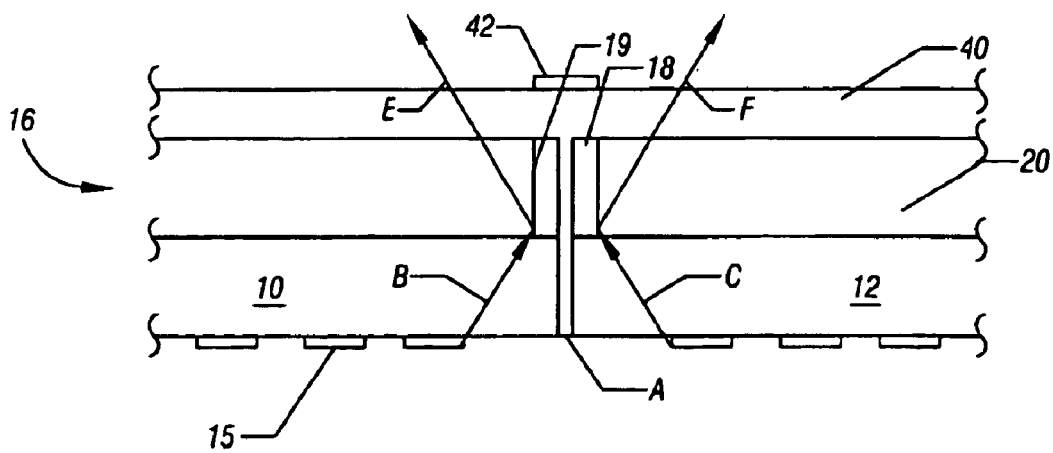
FIG. 3 is a partial, enlarged cross-sectional view of still another embodiment of the present invention.

In FIG. 3, each layer 10 and 12 is overlaid by a layer 16. In some embodiments, the layers 10 and 12 may be formed of glass. In some embodiments, the layer 16 may be formed of glass or plastic that is, at least in part, transparent. In particular, the layer 16 may include transparent regions 20 positioned more directly over the light emitting elements 15 and non-transparent regions 18 intermediate between adjacent regions 20. The layers 10 and 12 may be integrated to a layer 16 for example by conventional bonding techniques including heat welding and adhesive bonding as two examples.

In some embodiments, the non-transparent regions 18 may be rectangular or square and may be black in color throughout their thickness. The sides 19 of the region 18 may be coated to make them more reflective. This may be done by providing a mirrored or white surface as two examples. As a result, the rays B and C described in connection with FIG. 2 may be reflected from the sides 19 as indicated at E and F. In this way, light may still not be blocked, as was the case in FIG. 2, but a gap blocking, non-transparent region 18 of greater vertical dimensions may be provided.

Because of the imposition of the region 18 close to the light emitting elements 15, the gap A may be more effectively hidden. Also, in some cases the layers 10 and 12, reinforced by the layer 16, may be thinner.

In some cases, the layer 16 may be abutted against an adjacent layer 16 producing gaps between adjacent layers 16. These gaps may be obscured in some cases by using an overlying sheet 40. This overlying sheet 40, which may be called an optical integrating plate, may be utilized to assemble the various tiles that include the layers 10 and 12. The plate 40 may include mullions 42 to cover the gaps A. Those tiles together form the composite image of a large area display. In addition, an optical integrating plate may provide a diffusing effect to obscure any gaps between layers 16 in some cases.

The layer 16 may be formed in a variety of different fashions. It may be possible to diffuse a non-transparent material into the regions 18 while masking the transparent regions 20. However, as another embodiment, a lithography process may be used to etch a plurality of holes in the layer 16. The layer 16 may be transparent in general. Each of those holes may then be coated with a suitably reflective layer to form the sides 19. The remaining holes may then be filled with a dark or black material to form the regions 18.

Figure 4:
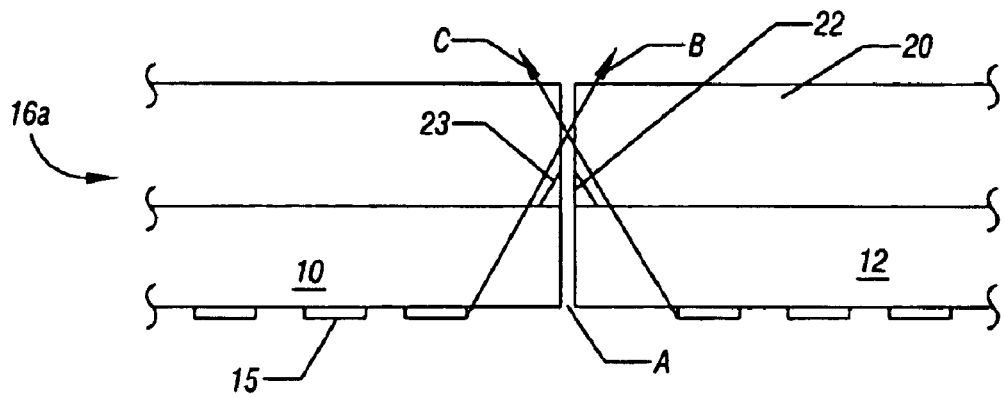
FIG. 4 is a partial, enlarged cross-sectional view of still another embodiment of the present invention.

Turning next to FIG. 4, in this case, black material 22 is formed in the layer 16a in a triangular shape. The sides 23 of the black material 22 may be oriented at an angle so as not to block the emitted rays B and C. Thus, in some cases, the sides 23 need not be made reflective, as was the case in the embodiment shown in FIG. 3.

Figure 5:
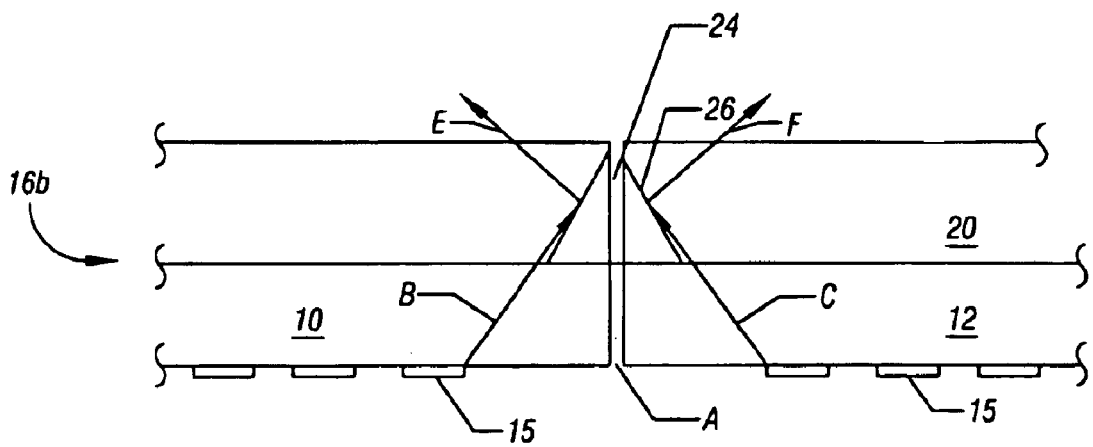
FIG. 5 is a partial, enlarged cross-sectional view of still another embodiment of the present invention.

However, in some cases, it may still be possible for some light to impact the sides 23 of the triangular black material 22. In such cases, it may still be desirable to make the sides 23 reflective. For example, as shown in FIG. 5, reflective sides 26 may be provided on a black triangular material 24 in a sheet 16b. The resulting reflected rays E and F reduce the loss of light which might otherwise occur. The embodiment shown in FIG. 5 may be advantageous, particularly in situations where relatively thick layers 10 and 12 are utilized. In the embodiments of FIGS. 4 and 5, an optical integrating plate 40 may be used as described in connection with FIG. 3.

In some cases, if the index of refraction of the material 24 is sufficiently lower than the index of refraction of the surrounding region 20, it may not be necessary to make the sides 26 reflective. Instead, the rays may be reflected due to the differences in indices of refraction between the material 24 and the region 20. In some cases, embodiments of the type shown in FIGS. 4 and 5 may exhibit less contrast improvement for the overall display compared to those of the type shown in FIG. 7 because of reflections off of the tapered sides 26 or 23. Thus, in situations where high contrast is desired, embodiments of the type shown in FIG. 3 may be preferable. In cases where the redistribution of the light may become a problem, embodiments of the type shown in FIG. 4 may be preferable.

Figure 6:
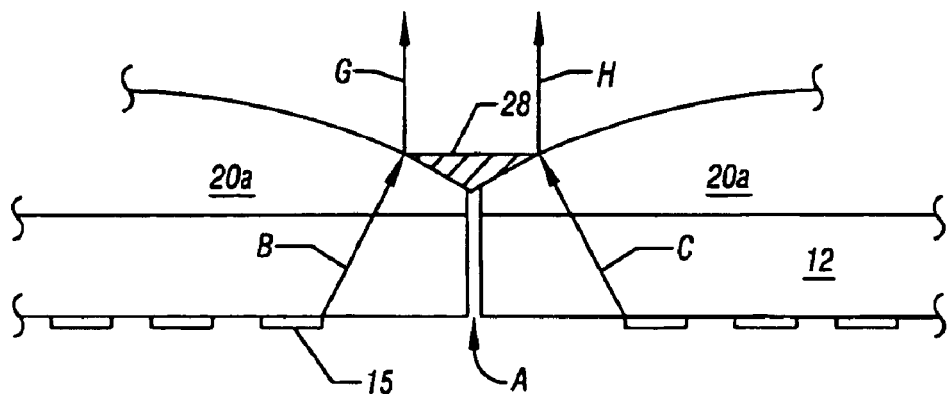
FIG. 6 is a partial, enlarged cross-sectional view of yet another embodiment of the present invention.

Referring next to FIG. 6, an optical structure may be provided that improves the optical separation between pixels. This structure may be made as a vertically laminated or multilayer structure, as shown in FIG. 6, or may be formed from a single layer. Each of the layers 10 and 12 may be associated with one or more hemispherical lenses 20a that may be described as microlenses. The lenses 20a may be formed of glass, plastic or other transparent materials.

The lenses 20a provide a means of concentrating emitted light from a pixel light emitting element 15 into the viewing space, providing a brighter display. Lenses 20a may also reduce the internally reflected light by waveguiding the light outwardly from the display. This is because the lenses 20a may increase the critical angle of the outbound light in some embodiments. Each lens 20a may be either one or two dimensional. In the case of linear lenses or one dimensional lenses, the lens 20a may be oriented horizontally so as to concentrate the light into a smaller vertical viewing zone.

Between each adjacent layer 10 or 12, over the gap A, a dark region 28 may be formed for example by deposition. The dark region 28 obscures the underlying gap A as was the case in previously described embodiments. In this case, the lateral extension of the region 28 may avoid obscuring the outbound light from the light emitting elements 15. The effect of the lenses 20a is indicated by the rays B and C, which are the rays most adjacent to gap A. The rays B and C are refracted, as indicated at G and H, towards the center of each lens 20a, effectively concentrating the resulting outbound light.

Figure 7:
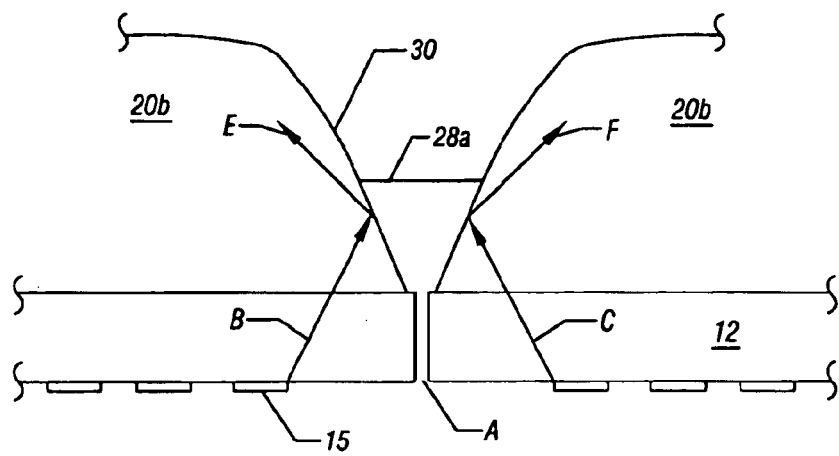
FIG. 7 is a partial, enlarged cross-sectional view of another embodiment of the present invention.

The use of lenses 20b (with a greater aspect ratio than those shown in FIG. 6) is illustrated in FIG. 7. In some cases, the lenses 20b may use refraction as well as internal reflection as indicated by the arrows E and F in FIG. 7. In some cases, a reflective coating may be applied to the external sides 30 of the lenses 20b. In other cases, total internal reflection may be utilized. A black matrix material 28a is situated between adjacent lenses 20b. In the embodiment shown in FIG. 7, the matrix material 28a may cover the sides 30 of the lenses 20b because of the use of internal reflection.

Figure 8:
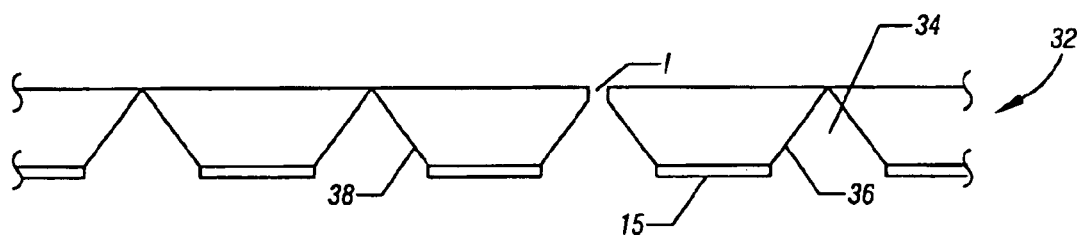
FIG. 8 is a partial, enlarged cross-sectional view of another embodiment of the present invention.

The use of a unitary cover plate 32 is shown in FIG. 8. In this example, the plate 32 may replace both the layers 10 and 12 and any overlying layer such as the layer 20. This may be possible because the plate 32 may be formed with integral optical elements 38. The plate 32 may be molded to the shape that is desired using plastic as one example. In other cases, the desired shape may be formed by grinding, sawing, abrasive jets, etching or other formation techniques. The elements 38 defined in the plate 32 may be triangular in one embodiment of the present invention. The triangular elements 38 reflect incoming light and obscure underlying gaps.

Figure 9:
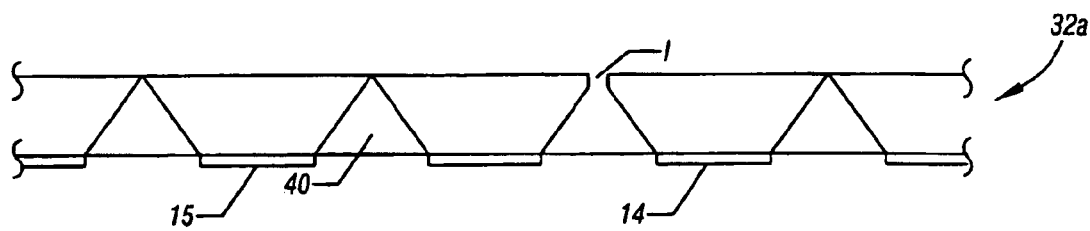
FIG. 9 is a partial, enlarged cross-sectional view of another embodiment of the present invention.

The elements 38 may be coated or filled with black or reflective materials to make optics that isolate or concentrate light from the pixels defined by elements 15. Thus, as shown in FIG. 9, a filler 40 is used in place of the open spaces (FIG. 8) that may make up part of the elements 38.

Where a coating is utilized as indicated at 38 in FIG. 8, the remaining opening area 34 may be utilized to locate electrodes, connections and other features. Thus, a contact 36 may be provided to metal or other conductive lines to reach the light emitting layer 15 in one embodiment.

The elements 38 may be open spaces with air which has a relatively low index of refraction. This may create, in some embodiments, total internal reflection without the need for a coating. Gaps may be defined between adjacent plates 32.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A display comprising:
   a display panel including a first display element on said panel; and
   a layer mounted on said panel including a central more transparent portion and a peripheral less transparent portion.

2. The display of claim 1 including a pair of abutting display panels, including a gap between said panels, an obscuring region situated over said gap.

3. The display of claim 2 wherein said layer is an integral piece including transparent and non-transparent regions, said non-transparent regions situated over said gap.

4. The display of claim 3 wherein said transparent and non-transparent regions are formed integrally in said layer.

5. The display of claim 4 wherein the sides of said non-transparent regions are made reflective.

6. The display of claim 5 wherein said non-transparent region is relatively rectangular.

7. The display of claim 5 wherein said nontransparent region is triangular.

8. The display of claim 5 wherein said nontransparent region is arranged to avoid obscuring emitted light from said element.

9. The display of claim 2 wherein said layer includes a lens element formed therein.

10. The display of claim 9 wherein a lens element is situated over each of said panels.

11. The display of claim 10 including a shield situated over said interface.

12. The display of claim 11 including a lens having an internal surface which reflects light.

13. The display of claim 1 wherein said shield has openings formed therein to obscure said interface.

14. The display of claim 13 wherein said openings are filled with a black material.

15. The display of claim 13 wherein said openings have light reflective coatings thereon.

16. A method comprising:
   abutting first and second display tiles at an interface; and
   applying a plate to a display panel to form said tiles, said plate having substantially transparent solid and substantially non-transparent solid regions formed therein, and situation said non-transparent regions over said interface.

17. The method of claim 16 including securing the layer over said first and second display tiles to obscure said interface.

18. The method of claim 16 including forming said non-transparent regions integrally in said plate with said transparent regions.

19. The method of claim 18 including forming reflective surfaces on the sides of said non-transparent regions.

20. The method of claim 16 including forming a plate over said first and second tiles, and forming a rectangular non-transparent region in said plate to obscure said interface.

21. The method of claim 16 including forming a plate over said first and second tiles including a triangular region formed therein, and situating said triangular region over said interface.

* * * * *

UNITED STATES PATENT AND TRADEMARK OFFICE
CERTIFICATE OF CORRECTION

PATENT NO. : 6,873,380 B2
DATED : March 29, 2005
INVENTOR(S) : Dennis L. Matthies and Zilan Shen It is certified that error appears in the above-identified patent and that said Letters Patent is hereby corrected as shown below:

Column 6,
Line 33, "situation" should be -- situating --.

Signed and Sealed this

Seventeenth Day of May, 2005

JON W. DUDAS
*Director of the United States Patent and Trademark Office*